United States Patent [19]

Tsuzuki et al.

[11] Patent Number: 5,667,596
[45] Date of Patent: Sep. 16, 1997

[54] PHOTOVOLTAIC DEVICE AND MANUFACTURING METHOD OF THE SAME

[75] Inventors: Koji Tsuzuki, Tsuzuki-gun; Katsuhiko Inoue, Nara; Takeshi Takada; Yoshifumi Takeyama, both of Tsuzuki-gun, all of Japan

[73] Assignee: Canon Kabushiki Kaisha, Tokyo, Japan

[21] Appl. No.: 789,876

[22] Filed: Jan. 28, 1997

Related U.S. Application Data

[63] Continuation of Ser. No. 552,230, Nov. 2, 1995, abandoned.

[30] Foreign Application Priority Data

Nov. 4, 1994 [JP] Japan ................................. 6-271628

[51] Int. Cl.$^6$ ............................ H01L 31/04; H01L 31/05; H01L 31/18
[52] U.S. Cl. ............................ 136/256; 136/244; 438/57; 438/98
[58] Field of Search ................................. 136/244, 256, 136/258 AM; 437/2

[56] References Cited

U.S. PATENT DOCUMENTS 5,131,956  7/1992  Oohara et al. ............... 136/256
5,457,057  10/1995  Nath et al. ................... 437/2

Primary Examiner—Aaron Weisstuch
Attorney, Agent, or Firm—Fitzpatrick, Cella, Harper & Scinto

[57] ABSTRACT

In a photovoltaic device comprising a conductive base plate having four side edges, at least one conductive foil having a higher conductivity than the conductive base plate is provided in contact with the conductive base plate along at least one side edge of the conductive base plate. The conductive foil is preferably provided on the non-light-receiving surface of the photovoltaic device, and comprises copper as a main ingredient. The conductive foil preferably has a thickness in the range of 70 µm to 150 µm and is provided along each of two side edges of the conductive base plate facing each other. The conductive base plate is a base plate made of stainless steel. In the photovoltaic device and a manufacture method thereof, the conductive foil and the conductive base plate are connected together by ultrasonic welding.

17 Claims, 8 Drawing Sheets

PHOTOVOLTAIC DEVICE AND MANUFACTURING METHOD OF THE SAME

This application is a continuation, of application Ser. No. 08/552,230 filed Nov. 2, 1995, now abandoned.

BACKGROUND OF THE INVENTION

1. Field of the Invention

The present invention relates to a photovoltaic device such as a solar cell and a photosensor, and a manufacturing method of the photovoltaic device.

2. Description of the Related Art

Photoelectric transducers which produce electromotive force upon impingement of light are utilized in various fields. Particularly, with an ever-increasing concern related to environmental problems in recent years, applications of solar cells as clean energy sources are increasingly anticipated.

At the present time, solar cells are mainly grouped into crystalline semiconductor cells using single crystal silicon or polycrystalline silicon, amorphous semiconductor cells using amorphous silicon, and compound semiconductor cells. Among these, amorphous silicon solar cells are expected to dominate the future developments because of their superior features relative to crystal solar cells. This is because a cell having a large area can be easily manufactured and the optical absorption coefficient of the amorphous silicon is so large that the cell can operate in the form of a thin film. However, the amorphous cells are inferior in conversion efficiency to crystalline solar cells.

One of the reasons why solar cells have not been widely used in spite of such expectancy is the high production cost of solar cells. Measures employed for reducing the production cost of solar cells are, for example, as follows:

(1) more efficient utilization of power generating areas, (2) reduction in the number of electrical connections, with resultant reduction in the cost of connection materials and in the labor cost required for connecting operations, and (3) reduction in the manufacturing cost of the photoelectric conversion layer, etc.

Realizing a solar cell having a large area is essential to achieve improvements in the above areas.

FIGS. 7(a) to 7(c) are schematic views showing a photovoltaic device of the prior art. FIG. 7(a) is a plan view of the photovoltaic device as viewed in the direction facing the light receiving surface, FIG. 7(b) is a sectional view taken along line 7b-7b' in FIG. 7(a), and FIG. 7(c) is a plan view representing two photovoltaic devices connected in series and FIG. 7(d) is a sectional view of the plan view of FIG. 7(c).

The photovoltaic device 700 shown in these Figures is manufactured by successively laminating a lower electrode layer 703 on a base plate 702 made of stainless steel or the like, a semiconductor layer 704 on the lower electrode layer 703, and an upper electrode layer 705 on the semiconductor layer 704. The upper electrode layer 705 is formed of a transparent conductive film such as indium oxide which serves as a reflection preventing means and a current collecting means.

Part of the transparent conductive film is removed along its periphery linearly as indicated by 701 (etching lines) by coating an etching paste, which contains $FeCl_3$, $AlC_3$, etc., by screen printing or the like and then heating the paste. The purpose of removing part of the transparent conductive film is to avoid a short circuit between the base plate and the transparent conductive film, that may possibly occur when the photovoltaic device is cut along its outer periphery, and adversely affecting the light conversion property of the photovoltaic device.

On the surface of the photovoltaic device 700, there are formed a plurality of collecting electrodes 707 for efficiently collecting the electric power generated by the device. In order to output the electric power generated in the semiconductor layer without loss, the collecting electrodes 707 are each formed by bonding a metal wire coated with a thin conductive adhesive (e.g., a copper wire coated with a carbon paste) onto the transparent conductive film. The reason for using a copper wire is to reduce current loss by utilizing the high conductivity of copper.

A conductive foil 708 is further disposed as an additional collecting electrode for the collecting electrodes 707. Under the conductive foil 708, an insulating member 709 is provided to ensure insulation between the conductive foil 708 and part of the transparent conductive film along the etching lines where the electrical characteristics are unstable.

In the photovoltaic device thus manufactured, the metal foil 708 and the base plate 702 of stainless steel function as opposite polarity terminals to output the generated electric power.

However, the photovoltaic device having the above structure is insufficient for practical use because the voltage generated by a single photovoltaic cell is too low. To realize a practically usable device, a plurality of cells must be connected in series to obtain an increase in the generated voltage.

FIG. 7(c) shows two photovoltaic devices shown in FIG. 7(a) connected in series. The conductive foil 710 of one photovoltaic device is connected to the base plate 711 of the other adjacent photovoltaic device by using a copper foil (connecting member) 712 so that the two photovoltaic devices are electrically connected in series. A solder containing a flux for stainless steel is used for the connection. After the soldering, the devices are washed by a solvent such as MEK (methyl ethyl ketone) to complete the serial connection.

In an attempt to enlarge the active area of the prior art solar cell explained above, the following problems arise in conversion efficiency with the increased cell area:

(1) Due to an increase in the amount of generated currents and in the length of the collecting electrode 710, the resistance loss ($i^2R$) is increased and the conversion efficiency is lowered.

(2) When a conductive base plate having a lesser conductivity, such as a stainless base plate, is employed, the resistance loss ($i^2R$) is increased and the conversion efficiency is lowered due to the increased path length of the current.

SUMMARY OF THE INVENTION

An object of the present invention is to solve problem (2) of the above two problems.

The above problem (2) will be described below in more detail with reference to FIGS. 8(a) to (c). FIGS. 8(a) and 8(b) illustrate current paths on stainless base plates of photovoltaic devices. FIG. 8(a) represents the case where each photovoltaic device has a conventional area, and FIG. 8(b) represents the case where each photovoltaic device has an enlarged area. FIG. 8(c) is a plan view of the photovoltaic devices each having an enlarged area shown in FIG. 8(b), as viewed in the direction facing the light impinging surfaces.

In FIG. 8(a), currents generated in a photovoltaic device 800 appear everywhere on a stainless base plate 801 and, as indicated by arrows, flow all at once over the stainless base plate 801 all at once into a serially connecting member 802. In the vicinity of the serially connecting member 802 (i.e., in the area A), all the currents generated in the photovoltaic device 800 are collected. While the resistance loss ($i^2R$) in this case is basically determined by the amount (i) of generated currents and the resistance (R) of the stainless base plate, the resistance loss is increased particularly in the area A because all the currents are concentrated there. For the photovoltaic device having a small area, however, such an increase in the resistance loss will not become so problematic because the amount of generated currents is small.

FIG. 8(b) illustrates current paths in the photovoltaic devices 810 having an enlarged area. The current paths are formed as in the case of FIG. 8(a) such that generated currents flow into a serially connecting member 812 over a stainless base plate 811. In this case, however, since the amount of generated currents is large and the length of the current paths on the stainless base plate is long, the resistance loss is considerably increased as the area B is approached, and the conversion efficiency is appreciably lowered as opposed to the case of FIG. 8(a).

Accordingly, the present invention provides a photovoltaic device comprising a conductive base plate having four side edges and at least one conductive foil, wherein said at least one conductive foil having a higher conductivity than said conductive base plate is provided in contact with said conductive base plate along at least one side edge of said conductive base plate.

DETAILED DESCRIPTION OF THE PREFERRED EMBODIMENTS

Initially, the dimensions and the resistance loss of the prior art photovoltaic devices will be described in detail.

Figure 8A:
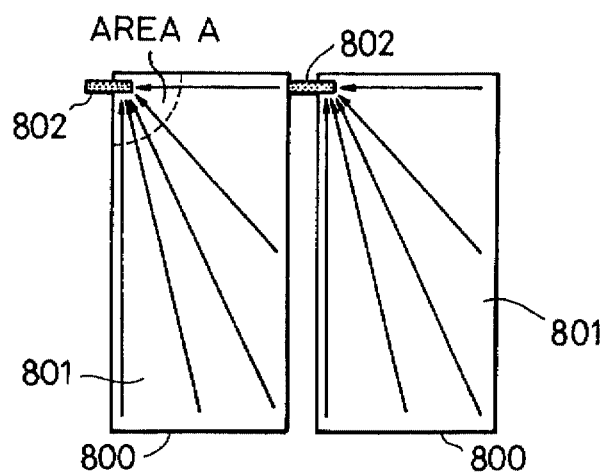
FIGS. 8(a), 8(b) and 8(c) are schematic views showing current paths in interconnected solar cells of the prior art.

The photovoltaic devices 800 shown in FIG. 8(a) are each in rectangular form, being 300 mm long and 100 mm wide (i.e., area of 300 cm$^2$), and comprise a stainless base plate 125 μm thick (volume resistivity of $6.0 \times 10^{-5}$ Ωcm). If the density of the generated current is 6.0 mA/cm$^2$ and the operating voltage is 1.5 V, the total electric power generated by each photovoltaic device is 2.7 W. Assuming now that the generated currents flow over the stainless base plate and are all concentrated toward the serially connecting member 802, the resistance loss is calculated as 0.09 W, which amounts to 3.51% of the total generated electric power.

Figure 8B:
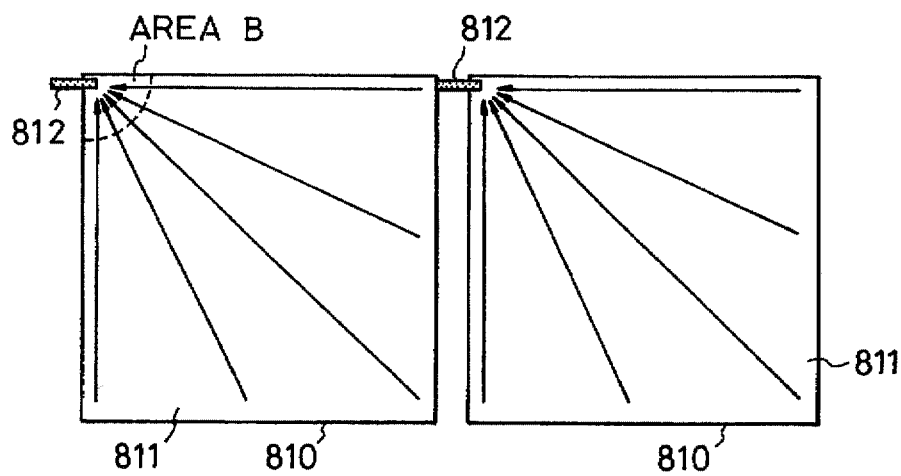
Figure 8C:
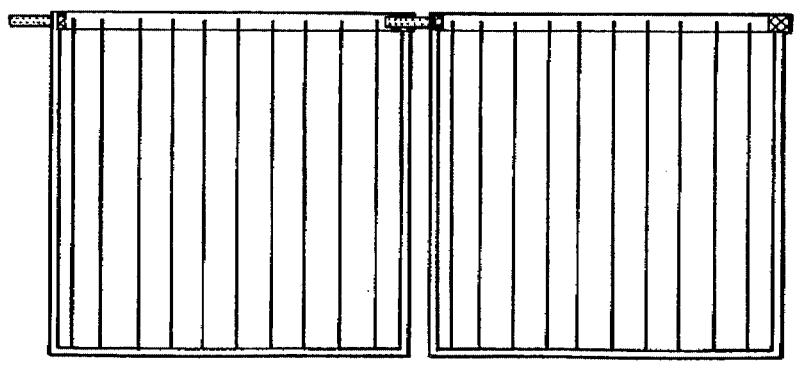

On the other hand, the photovoltaic devices 810 shown in FIG. 8(b) are each in square form of 300 mm×300 mm (i.e., area of 900 cm$^2$). By calculations based on the same assumption as in the above case of FIG. 8(a), the total electric power generated by each photovoltaic device is 8.1 W and the resistance loss of the stainless base plate is 0.61 W, which amounts to 7.52% of the total generated electric power and is more than twice the resistance loss produced in the small area photovoltaic devices 800.

From the above calculations, it has been determined that the problem of an increase in the resistance loss of a base plate is related to an increase in the area of a photovoltaic device.

To solve the above problem, it is required to provide a conductive foil on a conductive base plate, as will be described later. The conductive foil is generally connected by soldering or resistance welding. It has, however, been found that the following problems (1) and (2) arise when soldering is used, and the following problem (3) arises when resistance welding is used:

(1) When heat is applied from a soldering iron, the base plate may be deformed by the heat and flatness of the resultant solar cell may be lost.

(2) The flux is hard to remove even when using a solvent, and tends to cause rust under conditions of high temperature and high humidity. As a result, covering layers of the solar cell may peel off.

(3) If scattered sparks reach an active surface of the solar cell, the cell is short-circuited.

In view of the state of art explained above, an object of the present invention is to provide a photovoltaic device in which generated currents are collected in a decentralized manner and the resistance loss is small. Another object of the present invention is to provide a photovoltaic device which has the above feature and does not present any problem in installation.

The present invention provides a photovoltaic device comprising a conductive base plate having four side edges, wherein at least one conductive foil having a higher conductivity than the conductive base plate is provided in contact with the conductive base plate along at least one side edge of the conductive base plate.

In the photovoltaic device of the present invention, the conductive foil is provided on the non-light-receiving surface of the photovoltaic device.

In the photovoltaic device of the present invention, the conductive foil is made of copper as a main ingredient and has a thickness in the range of 70 μm to 150 μm.

In the photovoltaic device of the present invention, the conductive base plate is made of stainless steel.

In the photovoltaic device of the present invention, the conductive foil and the conductive base plate are welded together by ultrasonic welding.

In the photovoltaic device of the present invention, the conductive foil is provided along each of two side edges of the conductive base plate facing each other.

In the photovoltaic device of the present invention, a portion of the conductive base plate on which the conductive foil is provided is bent perpendicularly to the conductive base plate.

Further, the present invention provides a method of manufacturing a photovoltaic device, where the conductive foil and the conductive base plate are connected together by ultrasonic welding.

According to the present invention, in the photovoltaic device comprising a conductive base plate having four side edges, at least one conductive foil having a higher conductivity than the conductive base plate is provided in contact with the conductive base plate along at least one side edge of the conductive base plate. Therefore, currents flowing over the stainless base plate are decentralized in their directions rather than centralizing toward one point, so that the resistance loss can be reduced.

The operation of the photovoltaic device will now be described with reference to FIGS. 6(a) to 6(c).

Figure 6A:
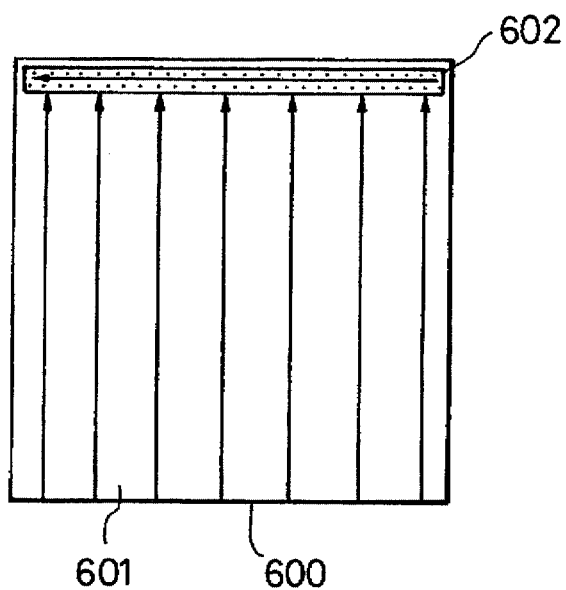
FIGS. 6(a), 6(b) and 6(c) are schematic views showing current paths in each of interconnected solar cells according to the present invention.

FIG. 6(a) shows a photovoltaic device 600 in which a copper foil 602 is connected to a stainless base plate 601 along one side edge thereof. Arrows in FIG. 6(a) indicate current paths. With the presence of the copper foil as shown in FIG. 6(a), generated currents flow toward the copper foil and the collected currents pass through the copper foil. As compared with the prior art (FIG. 8(b)), therefore, the present invention (FIG. 6(a)) is advantageous in that the lengths of the current paths on the stainless base plate are shortened and the collected currents flow through the copper foil having a smaller volume resistivity than stainless steel by one order of magnitude, resulting in a small resistance loss.

Calculating the resistance loss based on the condition that a copper foil (volume resistivity of $1.7 \times 10^{-6}$ Ωcm) 100 μm thick, 300 mm long and 7.5 mm wide is attached to the photovoltaic device shown in FIG. 8(b), the resistance loss by the stainless base plate is 0.046 W and the resistance loss by the copper foil is 0.066 W. That is, the total loss is 0.112 W. This value is 1.38% of the total generated electric power as compared with 7.52% in the prior art cell. Thus, the present invention is effective in reducing the resistance loss.

Figure 6B:
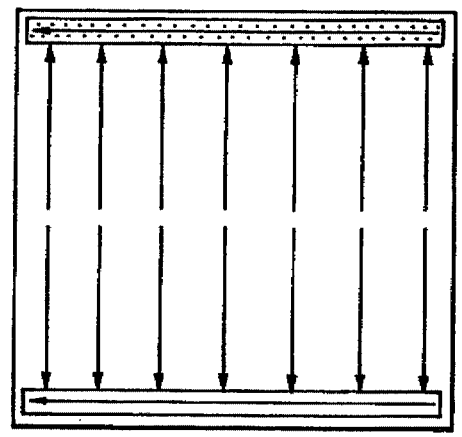
Figure 6C:
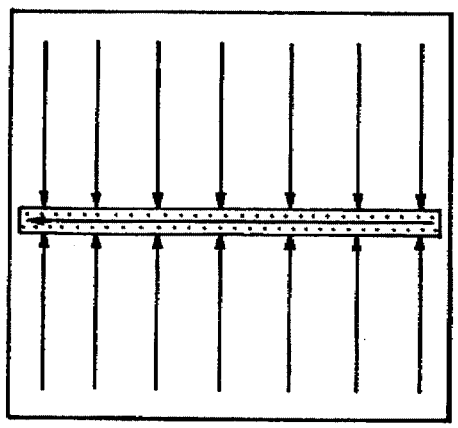
Figure 7A:
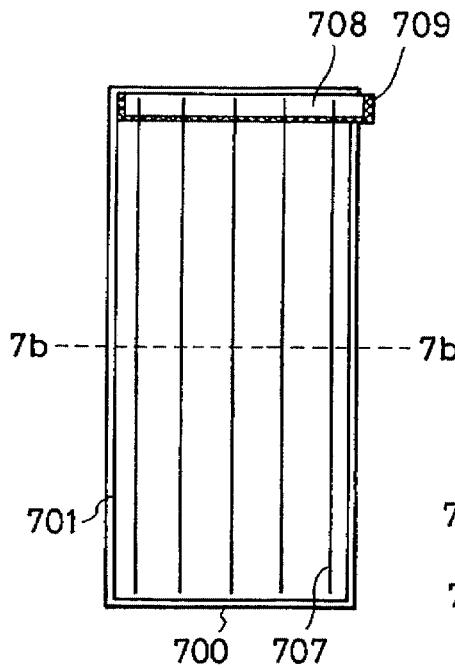
FIGS. 7(a), 7(b), 7(c) and 7(d) are schematic views showing a solar cell and a solar cell module of the prior art.
Figure 7B:
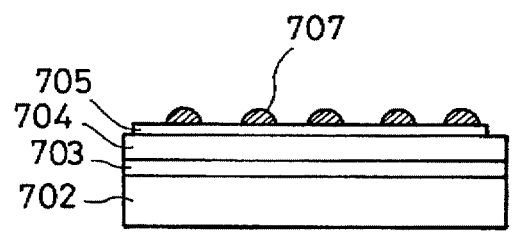
Figure 7C:
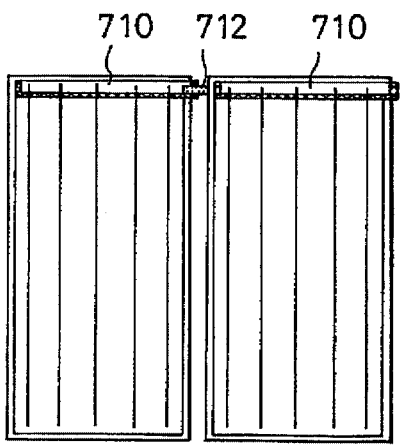
Figure 7D:
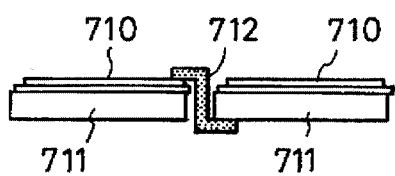

FIG. 6(b) shows a case where two copper foils are provided respectively along two side edges of the stainless base plate facing each other. The resistance loss in this case is calculated as 0.55% of the total generated electric power, showing that the loss can be further reduced.

The conductive foil may be provided in any quantity depending on the shape of the conductive base plate, and need not be limited to a single foil. It is preferable that the conductive foil have substantially the same length as that of the corresponding side edge of the conductive base plate on which the foil is provided.

The conductive foil may be provided on the light receiving surface or a non-light-receiving surface of the photovoltaic device. However, the conductive foil is preferably provided on the non-light-receiving surface in order that any loss in the intensity of received light, caused by providing a plurality of conductive foils or increasing the foil width, can be avoided.

Even when the conductive foil is provided on the non-light-receiving surface, it is preferably provided outside the effective region for power generation. FIG. 6(c) shows a case where the conductive foil is provided centrally of the photovoltaic device. In this case, the lengths of the current paths are shortened as with the case of FIG. 6(b), but there arises a problem in that the heat generated by soldering to fix the copper foil tends to damage the semiconductor layer because the copper foil is positioned on the back side of the active region of power generation. Consequently, it is especially desirable that the conductive foil be provided on the non-light-receiving surface outside the active region of power generation.

The conductive foil for use in the present invention is preferably made of materials which have a low volume resistivity and which are readily available on an industrial basis. One practical example is a copper foil which has good machinability and is relatively inexpensive.

When a copper foil is employed, a thin metal layer may be coated on the foil surface for preventing corrosion and oxidation. Usable materials for the surface metal layer are, e.g., rare metals which are hard to corrode, such as silver, palladium, alloy of silver and palladium, and gold, or other metals which have high corrosion resistance, such as nickel, tin, and solder.

The surface metal layer may be formed by, e.g., vaporization, plating or cladding, each of which can relatively easily form the layer.

The thickness of the conductive foil is preferably in the range of 70 μm to 150 μm. With a thickness not less than 70 μm, the conductive foil can have a cross-sectional area sufficient to accommodate the current density generated by the photovoltaic device, can practically serve as a mechanical coupling member, and can be protected from adverse effects such as possible damage caused during the connecting operation. The thicker the conductive foil, the smaller the resistance loss will be. With a thickness not greater than 150 μm, however, the conductive foil can be covered by a surface covering member in a moderate step. As the height difference is reduced, the thickness of the surface covering member can be decreased and the amount of covering materials can be correspondingly reduced.

The base plate is preferably conductive because, for solar cells using a thin film such as of amorphous silicon, it serves as a member for mechanically supporting the semiconductor layer and also as an electrode in some cases. Conductive materials for the base plate include, e.g., metals such as Fe, Cr, Al, Mo, Au, Nb, Ta, V, Ti, Pt, and Pb or alloys of two or more of them, sheets of brass, stainless steel, etc. and composites thereof, carbon sheet, and zinc plated steel sheet. Above all, stainless steel is preferable from the standpoint of preventing corrosion and oxidation over a long term.

The method of connecting the conductive base plate and the conductive foil to each other should satisfy the following two criteria. These criteria are not met if resistance welding incapable of covering a large contact area in one welding step, or soldering not free from deterioration of the deposited solder is employed.

(1) It is preferable to provide a large contact area between the conductive base plate and the conductive foil to reduce the resistance loss.

(2) The connection is desirably effected by metal bonding so as to be maintained for a long term.

However, a more preferable connecting method is ultrasonic welding that can cover a large contact area in one welding step and also can establish metal bonding.

When the conductive foil is provided along each of two side edges of the conductive base plate facing each other, a portion of the conductive base plate on which the conductive foil is provided can be bent perpendicularly to the conductive base plate. Since the base plate portion including the conductive foil is in the inactive region not contributing to power generation, the module efficiency can be increased by bending the portions of the conductive base plate on which the conductive foils are provided.

Further, as a method of manufacturing the photovoltaic device, ultrasonic welding is preferably used to connect the conductive foil and the conductive base plate to each other. The use of ultrasonic welding is effective in solving not only the problems mentioned above, but also the problem of reliability because covering members of solar cells may peel off due to any remaining solder flux, and the device may be damaged by scattered sparks during resistance welding.

Embodiments of the present invention will be described below.

Photovoltaic Device

The present invention can be applied to solar cells using single crystal, polycrystalline, and amorphous silicon. In addition, the invention is also applicable to solar cells using semiconductors other than silicon, and to solar cells having a Schottky junction. The following description will be made of an amorphous silicon solar cell as a typical example:

The solar cell of the present invention preferably comprises a conductive base plate, a lower electrode provided on the conductive base plate, a semiconductor layer provided on the lower electrode, contributing to power generation and a collecting electrode provided on a light impinging surface of the semiconductor layer. If desired, an upper electrode layer (transparent conductive layer) may be provided between the light impinging surface of the semiconductor layer and the collecting electrode for the purposes of preventing reflection and reducing surface resistance.

Lower Electrode

The lower electrode for use in the present invention is for outputting the electric power generated by the semiconductor layer. Materials forming the lower electrode are required to have a work function providing an ohmic contact to the semiconductor layer. Examples of the materials are simple metals such as Al, Ag, Pt, Au, Ni, Ti, Mo, Fe, V, Cr, Cu, stainless steel, brass, Nichrome, $SnO_2$, $In_2O_3$, ZnO, and ITO or alloys of two or more of these ($SnO_2$, ZnO, $In_2O_3$, ITO are TCO materials).

The surface of the lower electrode is preferably smooth, but may be textured when it is desired to produce diffuse reflection of light. If the base plate is conductive, the lower electrode may be dispensed with.

The lower electrode can be formed by plating, vaporization, or sputtering.

Semiconductor Layer

The semiconductor layer for use in the present invention can be formed of known semiconductor materials which are generally employed in the field of thin film solar cells. The semiconductor layer of the solar cell according to the present invention includes, e.g., a pin-junction amorphous silicon layer, a pn-junction polycrystalline silicon layer, and a compound semiconductor layer such as $CuInSe_2$/CdS.

The semiconductor layer can be formed as follows. When the semiconductor layer is an amorphous silicon layer, it can be formed by, e.g., plasma CVD that produces plasma discharge in a raw material gas, such as a silane gas, used to form a silicon film. When the semiconductor layer is a pn-junction polycrystalline silicon layer, it can be formed by, e.g., a method of forming a thin film from molten silicon. When the semiconductor layer is $CuInSe_2$/CdS, it can be formed by electron beam vaporization, sputtering, or electrolytic precipitation.

Upper Electrode (Transparent Electrode Layer)

The upper electrode for use in the present invention serves as an electrode for outputting the electric power generated by the semiconductor layer in combination with the lower electrode. The upper electrode is required when the semiconductor layer has high sheet resistance like amorphous silicon, and is not always required for crystalline line solar cells having low sheet resistance. Since the upper electrode is positioned on the light impinging side, it must be transparent and hence is also called a transparent electrode. The light transmissivity of the upper electrode is preferably not less than 85% so that light from the sun, white fluorescent lamps, etc. can be efficiently absorbed by the semiconductor layer. It is also preferable for the upper electrode to have a sheet resistance value not less than 100 Ω/☐ so that currents generated by the incident light flow parallel to the semiconductor layer. Materials having the above characteristics are e.g., metal oxides such as $SnO_2$, $In_2O_3$, ZnO, CdO, $CdSnO_4$, and ITO ($In_2O_3+SnO_2$).

Collecting Electrode

The collecting electrode for use in the present invention is generally in the form of a comb, and its preferable width and pitch are determined depending on the sheet resistance values of the semiconductor layer and the upper electrode. The resistivity of the collecting electrode is required to be so small as not to serve as a serial resistance of the solar cell. A preferable value of the resistivity is in the range of $10^{-2}$ Ωcm to $10^{-6}$ Ωcm. Materials usable as the collecting electrode are, e.g., metals such as Ti, Cr, Mo, W, Al, Ag, Ni, Cu, Sn, and Pt or alloys of two or more of same, and a solder. While a metal paste prepared by mixing metal powder and a high polymer resin binder is usually employed, the material of the collecting electrode is not limited to such a metal paste.

Examples of the present invention will be described below with reference to FIGS. 1 to 6.

EXAMPLE 1

Figure 1A:
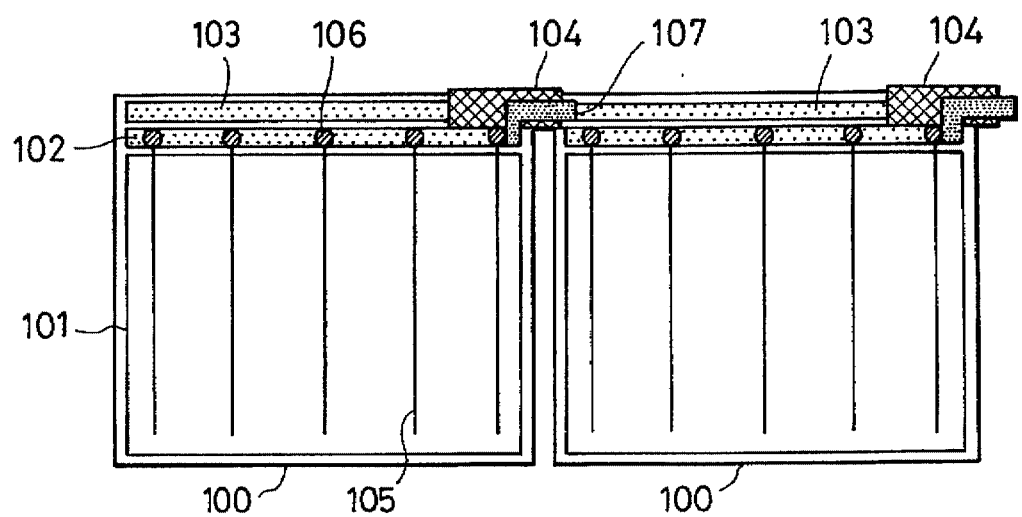
FIG. 1(a) is a schematic view of a solar cell module according to Example 1 and FIGS. 1(b) and 1(c) are schematic views of Comparative Example 1.

In Example 1, a photovoltaic device comprising an amorphous silicon solar cell with a base plate made of stainless steel will be described in detail with reference to FIG. 1(a). FIG. 1(a) is a schematic view of a solar cell module in which two solar cells of the present invention are connected in series, as viewed in the direction facing the light impinging surfaces.

First, as the base plate of the solar cells, a rolled stainless base plate formed of a stainless steel foil (volume resistivity of $6.0\times10^{-5}$ Ωcm) 0.1 mm thick and having a washed surface was prepared.

Then, a plurality of solar cells were simultaneously formed on the surface of the stainless base plate. The solar cells were each of a structure having multilayered films as shown in Table 1 below.

TABLE 1

| Name of base plate - layer/ thickness | Underlying layer | Forming method/ temperature | Material used |
|---|---|---|---|
| stainless base plate /0.1 mm | — | —/— | — |
| ZnO film /500 nm | stainless base plate | sputtering /350° C. | ZnO |
| n-type a-Si layer (1) /15 nm | ZnO film /250° C. | P-CVD | $SiH_4$, $PH_3$, $H_2$ |
| i-type a-Si layer (1) /400 nm | n-type a-Si layer (1) | P-CVD /250° C. | $SiH_4$, $H_2$ |
| p-type a-Si layer (1) /10 nm | i-type a-Si layer (1) | P-CVD /250° C. | $SiH_4$, $BF_3$, $H_2$ |
| n-type a-Si | p-type a-Si | P-CVD | $SiH_4$, $PH_3$, $H_2$ |

TABLE 1-continued

| Name of base plate · layer/ thickness | Underlying layer | Forming method/ temperature | Material used |
|---|---|---|---|
| layer (2) /10 nm | layer (1) | /250° C. | |
| i-type a-Si layer (2) /80 nm | n-type a-Si layer (2) | P-CVD /250° C. | SiH$_4$, H$_2$, |
| p-type a-Si layer (2) /10 nm | i-type a-Si layer (2) | P-CVD /250° C. | SiH$_4$, BF$_3$, H$_2$ |
| ITO layer /70 nm | p-type a-Si layer (2) | vaporization /250° C. | In, Sn, O$_2$ |

By cutting the rolled stainless steel base plate on which the multilayered films were formed, two solar cells (each being of 30.0 cm×30.0 cm) 100 as shown in FIG. 1(a) were manufactured.

These solar cells 100 were each treated as follows in successive steps.

(1) A paste containing an ITO etching material (FeCl$_3$) was coated on the surface of the solar cell 100 as a pattern 101 (28.2 cm×29.4 cm) by screen printing and then washed with purified water to remove a portion of the ITO layer for positive electrical isolation between the upper electrode and the lower electrode.

(2) An insulating tape (not shown) of polyimide was pasted onto the cell surface just outside the etched region, and a copper foil 102 of 100 μm thickness was pasted onto the insulating tape by using a double-coated adhesive tape. The copper foil 102 in this stage was electrically floating.

(3) A soft copper foil 103 according to the present invention of 100 μm thickness was joined to the cell surface just outside and parallel to the copper foil 102 by soldering as shown in FIG. 1(a), and was electrically connected to the lower electrode. The soft copper foil 103 had a volume resistivity of 1.7×10$^{-6}$ Ωcm, which is higher than that of the stainless steel base plate, even taking into account the relatively small cross-sectional area of the copper foil.

(4) A right end portion of the copper foil 103 was covered by an insulating tape 104 of polyimide, as shown in FIG. 1(a).

(5) Silver coated wires (separately prepared by coating a silver paste in a thickness of 20 μm over a copper wire having a diameter of 100 μm, and drying the paste) were arranged as shown in FIG. 1(a) and pressed at 150° C. for 20 seconds under a pressure of 1 atm. for bonding to the active area of the solar cell, thereby forming the collecting electrodes 105.

(6) For electrical connection between the copper foil 102 and the collecting electrodes 105, a silver paste was applied to the ends of the collecting electrodes 105 on the copper foil 102 in the form of spots, i.e., as silver dots 106, and then hardened by heating in an oven. This enabled the copper foil 102 to serve as an output electrode from the upper electrode.

(7) An L-shaped metal foil 107 prepared by punching a copper foil of 100 μm thickness with the aid of a die was attached as shown in FIG. 1(a). One end of the metal foil 107 was soldered to the copper foil (upper electrode) 102 of one solar cell, and the other end of the metal foil 107 was soldered to the copper foil (lower electrode) 103 of the adjacent solar cell. Thus, the two cells were connected in series.

Through the steps explained above, a cell solar cell module comprising two solar cells connected in series was completed.

Results of measuring the characteristics of the solar cell module of Example 1 by using a simulator are shown below. Here, the simulator means a dummy solar light source having an AM 1.5 global solar spectrum and luminous power of 100 W/cm$^2$. The measured conversion efficiency was 8.00% and the serial resistance was calculated as 27 Ωcm$^2$.

COMPARATIVE EXAMPLE 1

Comparative Example 1 differs from the above Example 1 in that, instead of providing the soft copper foil (lower electrode) 103 as shown in FIG. 1(a), a rectangular metal foil 108 is directly connected to the stainless base plate for serial connection.

Figure 1B:
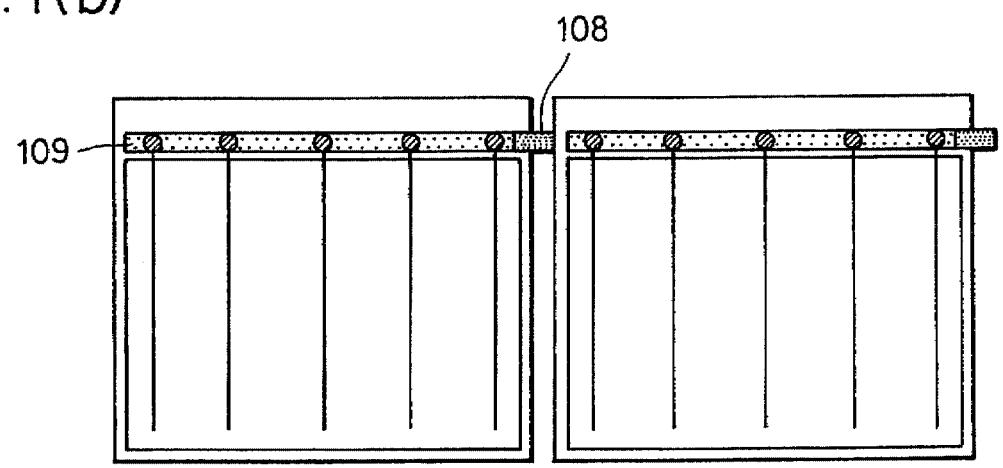
Figure 1C:
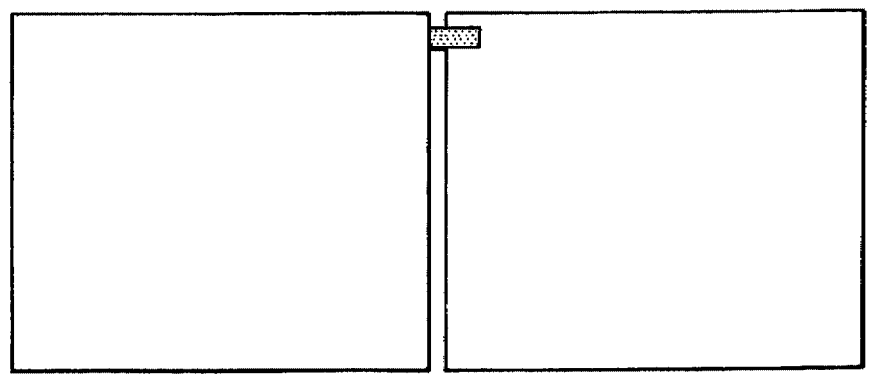

Comparative Example 1 will be described in more detail with reference to FIGS. 1(b) and 1(c). FIG. 1(b) is a schematic view of a solar cell module in which two solar cells of Comparative Example 1 are connected in series, as viewed in the direction facing light impinging surfaces. FIG. 1(c) is a schematic rear view of the solar cell module of FIG. 1(b).

One end of the rectangular metal foil 108 was soldered to a copper foil (upper electrode) 109 of one solar cell, and the other end of the metal foil 108 was soldered to a stainless base plate on the rear side of the adjacent solar cell. Thus, the two solar cells were connected in series. The region of each of the copper foil 109 and the stainless base plate where the metal foil 108 was soldered was circular with a diameter of about 5 mm.

Except for the foregoing, the solar cell module of Comparative Example 1 was manufactured in the same manner as Example 1.

Characteristics of the solar cell module of this Comparative Example 1 were also measured by using the same simulator as in Example 1. As a result, the measured conversion efficiency in Comparative Example 1 was 7.48% and the serial resistance was calculated as 32 Ωcm$^2$.

Based on theoretical loss calculations, the difference in conversion efficiency between Example 1 and Comparative Example 1 was about 0.5%. It was thus confirmed that the difference between the above measured values agreed with the theoretical value.

Accordingly, an increase in the serial resistance of Comparative Example 1 was inferred as being attributable to the stainless steel base plate. This led to a conclusion that by providing, on the conductive base plate, a copper foil having a higher conductivity than the conductive base plate, it is possible to reduce the serial resistance which results when connecting solar cells in series, and to greatly increase the conversion efficiency.

EXAMPLE 2

Example 2 differs from Example 1 in that a soft copper foil 203 is provided on the non-light-receiving surface of the solar cell.

Figure 2A:
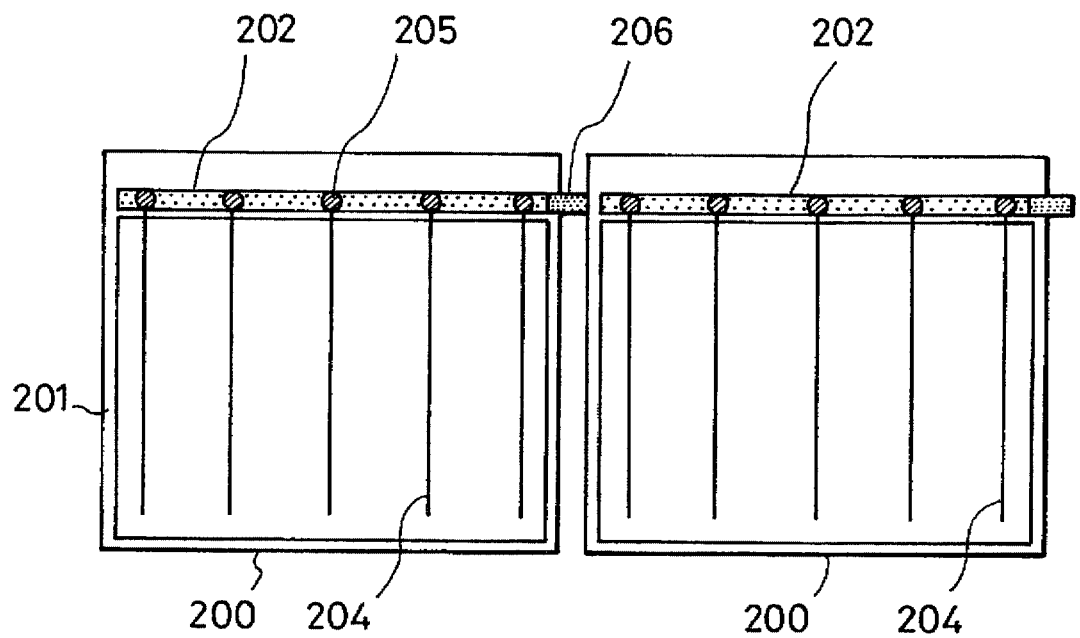
FIGS. 2(a) and 2(b) are schematic views of a solar cell module according to Example 2.
Figure 2B:
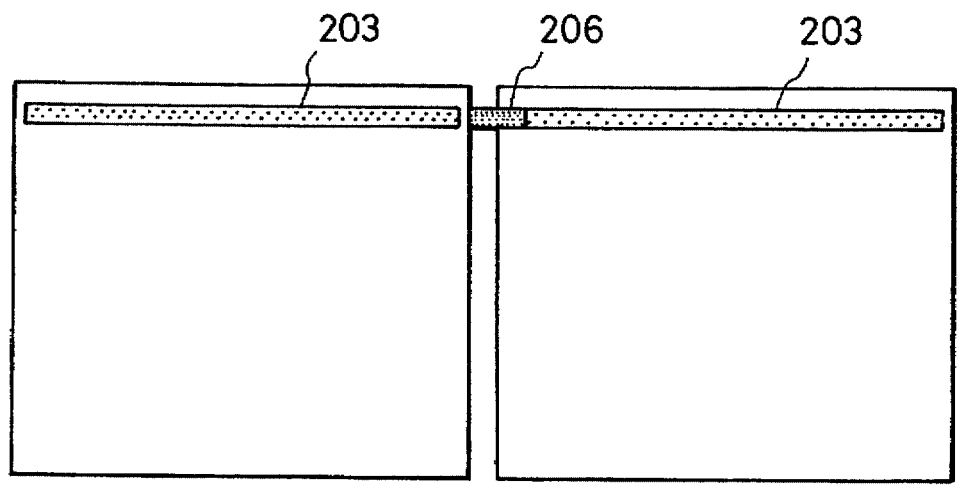

Example 2 will be described in more detail with reference to FIGS. 2(a) and 2(b). FIG. 2(a) is a schematic view of a solar cell module in which two solar cells are connected in series, as viewed in the direction facing the light impinging surfaces. FIG. 2(b) is a schematic rear view of the solar cell module of FIG. 2(a).

The solar cells 200 used in this Example 2 were the same as those used in Example 1. As with Example 1, a paste containing an ITO etching material was coated on the surface of the solar cell 200 as a pattern 201 (28.9 cm×29.4 cm) by screen printing and then washed by purified water to remove a portion of the ITO layer.

The solar cells 200 were each treated as follows in successive steps.

(1) A soft copper foil 203 of 100 μm thickness was placed on the non-light-receiving surface as shown in FIG. 2(b), and soldered at five points at equal intervals for electrical connection to the lower electrode. For the soldering, a special solder (containing halogen) for stainless steel was employed. The flux was washed off by MEK after the soldering.

(2) A copper foil 202, collecting electrodes 204, and silver dots 205 were formed successively in a like manner to Example 1. Finally, a rectangular metal foil 206 was attached as shown for serial connection between the two solar cells.

Except for the foregoing, the solar cell module of this Example 2 was manufactured in the same manner as Example 1.

Characteristics of the solar cell module of this Example 2 were also measured by using the same simulator as in Example 1. As a result, the measured conversion efficiency in this Example 2 was 8.05% and the serial resistance was calculated as 26.8 $\Omega cm^2$.

The resulting values in this Example 2 were comparable to those in Example 1. It was thus confirmed that essentially the same advantage was obtained regardless of whether the copper foil was provided on the light receiving side or on the non-light-receiving side.

In Example 2 where the copper foil was provided on the back side, the active area contributing to power generation (i.e., the area surrounded by etching lines 201) was 849.66 $cm^2$, which was larger than 829.08 $cm^2$ by an amount of 20.58 $cm^2$. This led to the conclusion that when the copper foil is provided on the non-light-receiving surface, a space otherwise required to be provided on the light receiving side can be dispensed with and the effective area for power generation can be increased correspondingly, resulting in increased module efficiency.

EXAMPLE 3

Example 3 differs from Example 1 in that a soft copper foil 303 is provided on the non-light-receiving surface of the solar cell along each of two side edges facing each other.

Figure 3A:
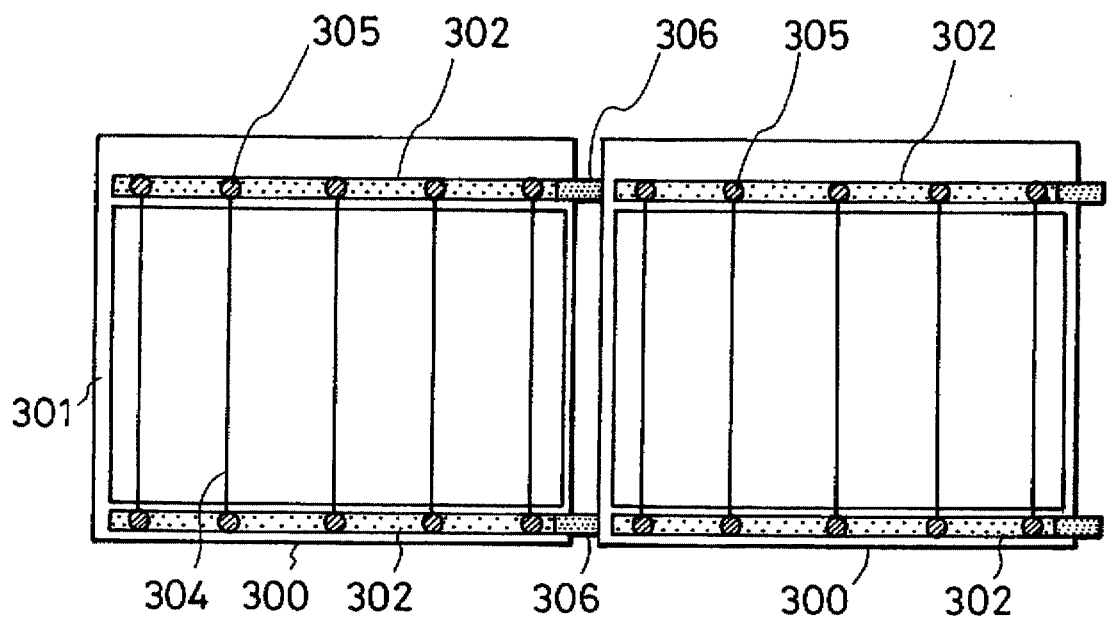
FIGS. 3(a) and 3(b) are schematic views of a solar cell module according to Example 3.
Figure 3B:
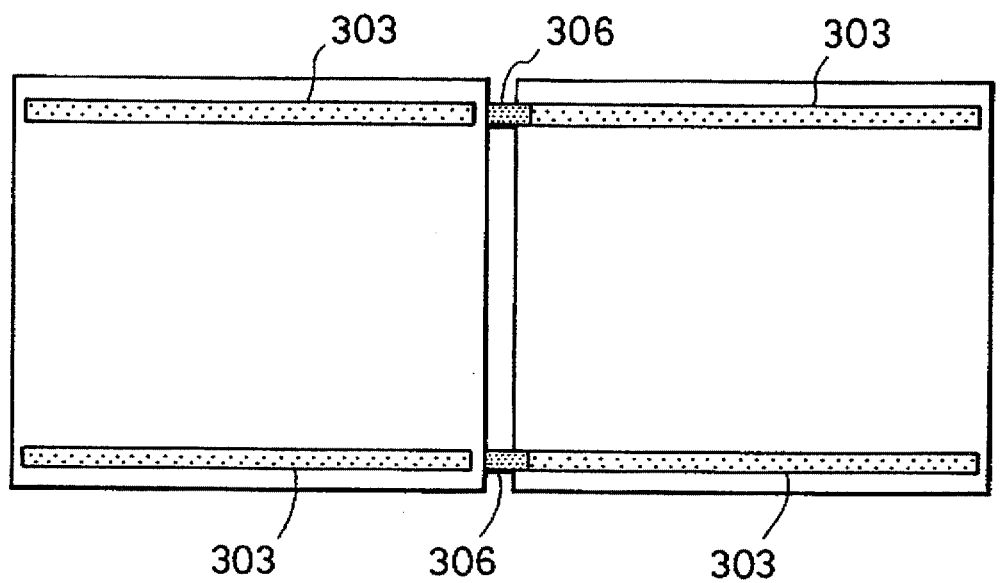

Example 3 will be described in more detail with reference to FIGS. 3(a) and 3(b). FIG. 3(a) is a schematic view of a solar cell module in which two solar cells are connected in series, as viewed in the direction facing the light impinging surfaces. FIG. 3(b) is a schematic rear view of the solar cell module of FIG. 3(a).

The solar cells 300 used in this Example 3 were the same as those used in Example 1. As with Example 1, a paste containing an ITO etching material was coated on the surface of the solar cell 300 as a pattern 301 (28.2 cm×29.4 cm) by screen printing and then washed with purified water to remove a portion of the ITO layer.

The solar cells 300 were each treated as follows in successive steps.

(1) A soft copper foil 303 of 100 μm thickness was placed on the non-light-receiving surface along each of two side edges facing each other as shown FIG. 3(b), and soldered at five points with equal intervals for electrical connection to the lower electrode. For the soldering, a special solder (containing halogen) for stainless steel was employed. The flux was washed off by MEK after the soldering.

(2) An insulating tape (not shown) of polyimide was pasted onto the light receiving surface at a position just outside the etched region and opposite in relation to each copper foil 303. A copper foil 302 of 100 μm thickness was pasted onto the insulating tape by using a double-coated adhesive tape. The copper foil 302 was also provided along each of two side edges of the solar cell 300 facing each other, as shown in FIG. 3(a).

(3) Collecting electrodes 304 and silver dots 305 were formed successively in the same manner as Example 1.

Finally, two metal foils 306 were attached as shown for serial connection between the two cells. One end of the metal foil 306 was soldered to the copper foil (upper electrode) 302 of one solar cell, and the other end of the metal foil 306 was soldered to the copper foil (lower electrode) 303 of the adjacent solar cell. Thus, the two solar cells were connected in series.

Except for the foregoing, the solar cell module of this Example 3 was manufactured in the same manner as Example 1.

Characteristics of the solar cell module of this Example 3 were also measured by using the same simulator as in Example 1. As a result, the measured conversion efficiency in Example 3 was 8.07% and the serial resistance was calculated as 25 $\Omega cm^2$.

From a comparison of the results of Example 3 with those in Example 1, it is apparent that the serial resistance was reduced and the conversion efficiency was increased. It was thus concluded that the two copper foils connected to the stainless base plate reduced the resistance of current paths on the stainless base plate, which resulted in an increase in the conversion efficiency and a reduction in the serial resistance.

From the above, the advantage of providing the conductive foils along two side edges of the conductive base plate facing each other was confirmed.

EXAMPLE 4

In this Example 4, the initial conversion efficiency, the serial resistance, and the shunt resistance were measured for each of three kinds of solar cell modules A, B, and C described below:

Solar cell module A: a solar cell module of exactly the same structure as that shown in Example 3.

Solar cell module B: a solar cell module of exactly the same structure as that shown in Example 3 except that the copper foils provided on the rear surface were welded by resistance welding.

Solar cell module C: a solar cell module of exactly the same structure as that shown in Example 3 except that the copper foils provided on the rear surface were welded by ultrasonic welding.

The initial conversion efficiency, the serial resistance, and the shunt resistance of the solar cell modules A, B and C are listed in Table 2 below.

TABLE 2

| Name of module | Conversion efficiency (%) | Serial Resistance (Ωcm²) | Shunt Resistance (Ωcm²) |
|---|---|---|---|
| Solar cell module A | 8.05 | 25.2 | 140 |
| Solar cell module B | 6.98 | 25.0 | 7 |
| Solar cell module C | 8.06 | 25.7 | 135 |

As seen from Table 2, the initial conversion efficiency of the solar cell module B subjected to resistance welding was 6.98%, i.e., substantially lower than the other modules. From the result of the solar cell module B having an extremely small shunt resistance, it was inferred that the module was partly short-circuited by scattered sparks. Also, it was confirmed that there was no appreciable difference in characteristics between the solar cell modules A and C, and results of the foil connection made by ultrasonic welding and soldering were comparable.

A description will now be made of results of carrying out a reliability test on the solar cell modules A, B, and C. The reliability tests were conducted in accordance with the temperature/humidity cycle test A-2 stipulated in Environmental Test Method and Durability Test Method for Crystalline Solar Cell Modules of Japanese Industrial Standards C8917.

Each of the solar cell modules was placed in a thermo-hygrostat capable of adjusting temperature and humidity, and the cycle test of changing the relative humidity in the range of −4° C. to +85° C. was repeated 100 times.

The conversion efficiency, the serial resistance, and the efficiency drop rate of the solar cell modules A, B, and C after the test are listed in Table 3 below.

TABLE 3

| Name of module | Conversion efficiency (%) | Serial Resistance (Ωcm²) | Efficiency drop rate (%) |
|---|---|---|---|
| Solar cell module A | 7.78 | 29.5 | 3.4 |
| Solar cell module B | 6.97 | 25.2 | 0.1 |
| Solar cell module C | 8.05 | 25.6 | 0.1 |

As seen from Table 3, the solar cell module C using ultrasonic welding to connect the copper foils showed a drop of the conversion efficiency of 0.1%, i.e., no significant deterioration, whereas the solar cell module A using soldering to connect the copper foils showed an efficiency drop of 3.4%. As a result of observing the solar cell modules after the test, the solder in the solar cell module A was found crumbled and brittle, and the copper foils were easily peeled off by hand. It was thus confirmed that ultrasonic welding is superior in establishing stability of the foil connection from the standpoint of long-term reliability.

In addition, the time required for soldering and the time required for ultrasonic welding were measured for comparison. The time required for one worker to complete the soldering from start to washing off of the flux was about 4.5 minutes per cell. In contrast, the time required to complete the ultrasonic welding by using an automatic welder was about 5 seconds per cell and the step of flux washing was eliminated. It was thus concluded that ultrasonic welding is more effective in reducing the production cost.

EXAMPLE 5

In Example 5, the initial conversion efficiency, the presence or absence of copper foil cracks, and the presence or absence of air bubbles were determined while varying the thickness of the copper foil.

Copper foils having seven different thicknesses of 35, 50, 70, 100, 150, 200, and 300 μm (but all having the same width of 7.5 mm) were prepared. Solar cell modules D, E, F, G, H, I, and J of exactly the same structure as the solar cell module C manufactured in Example 4 were manufactured using the respective copper foils.

The copper foil thickness, the initial conversion efficiency, the presence or absence of copper foil cracks, and the presence or absence of air bubbles in the solar cell modules D to J are listed in Table 4.

TABLE 4

| Name of module | Thickness of copper foil (μm) | Conversion efficiency (%) | Cracks in copper foil | Air bubbles |
|---|---|---|---|---|
| Solar cell module D | 35 | 8.01 | found | none |
| Solar cell module E | 50 | 8.04 | found | none |
| Solar cell module F | 70 | 8.06 | none | none |
| Solar cell module G | 100 | 8.07 | none | none |
| Solar cell module H | 150 | 8.08 | none | none |
| Solar cell module I | 200 | 8.09 | none | found |
| Solar cell module J | 300 | 8.09 | none | found |

As seen from Table 4, in the solar cell modules D and E with the copper foils of 50 μm or less thickness, the copper foils were cracked by ultrasonic vibrations arising during the step of ultrasonic welding.

Figure 4:
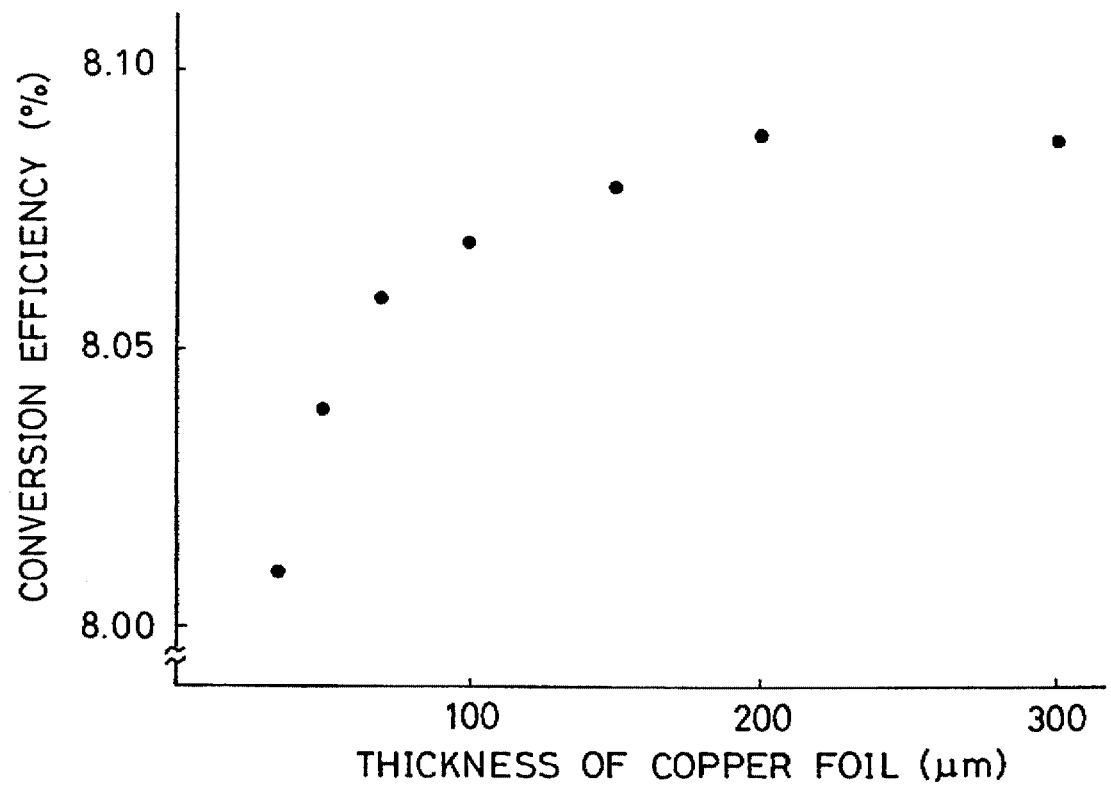
FIG. 4 is a graph showing the relationship between thickness of a copper foil and conversion efficiency according to Example 5.

FIG. 4 is a graph showing the relationship between thickness of the copper foil and conversion efficiency.

With the increased thickness of the copper foils, the conversion efficiency was raised because of a reduction in the resistance loss of the copper foils, but the measured results indicated substantial saturation for the copper foils having a thickness of 200 μm and more. In the case of the solar cell modules with the thickness of the copper foils being smaller than 70 μm, it was noted that the conversion efficiency dropped abruptly.

Generally, for the purposes of protecting the cell surface from damage and the module from moisture, the solar cell module after completion of the step of connecting cells in series is coated with an organic resin layer. In Example 5, the above seven solar cell modules D to J were each coated with an organic resin layer by using EVA (ethylene vinylacetate) as an adhesive layer and ETFE (copolymer of ethylene and tetrafluoroethylene) as a surface protective layer, and bonding the two layers together under heating and pressure by using a vacuum laminator.

As a result, the organic resin layer was satisfactorily formed on the solar cell modules D to H, but air bubbles occurred in the copper foils for the solar cell modules I and J. After conducting experiments to examine the occurrence of air bubbles, it was confirmed that when the thickness of the copper foil was 200 μm or more, portions were not pressed under a sufficiently high degree of pressure and air remained there, leaving air bubbles in the copper foil.

From the above results, it was concluded that the thickness of the conductive foil is preferably in the range of 70 μm to 150 μm.

EXAMPLE 6

In Example 6, an advantage of bending a portion of the conductive base plate on which the conductive foil was formed perpendicularly to the conductive base plate was studied.

Figure 5A:
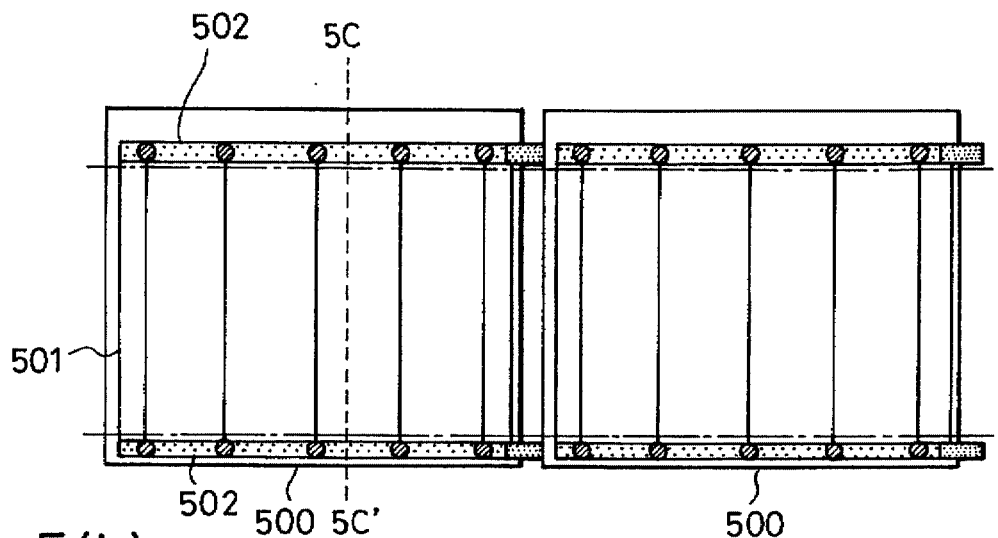
FIGS. 5(a), 5(b) and 5(c) are schematic views of a solar cell module according to Example 6.
Figure 5B:
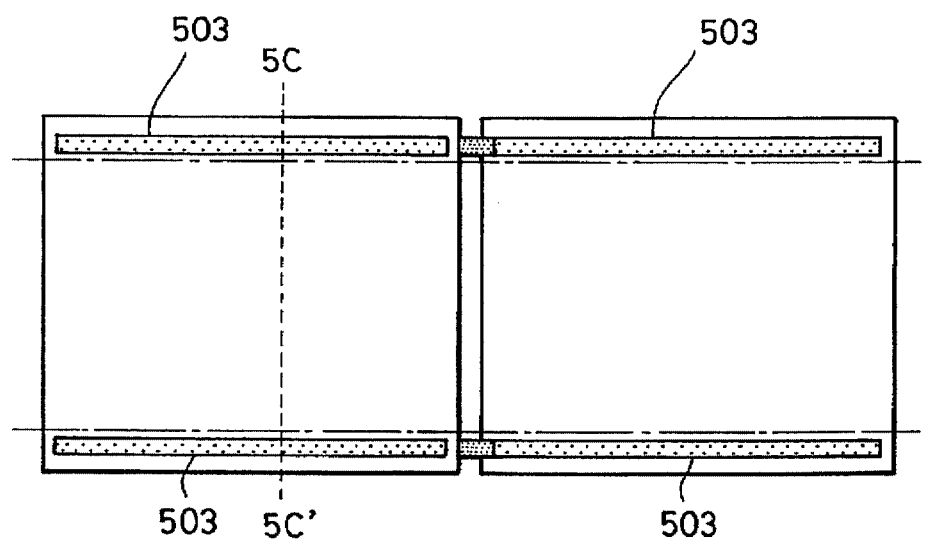

Example 6 will be described in more detail with reference to FIGS. 5(a) and 5(b). FIG. 5(a) is a schematic view of a solar cell module in which two solar cells are connected in series, as viewed in the direction facing the light impinging surfaces. FIG. 5(b) is a schematic rear view of the solar cell module of FIG. 5(a).

A solar cell 500 of exactly the same structure as that used in Example 3 was prepared. Ten solar cell modules each comprising five solar cells connected in series were manufactured (Figures show only a 2-serial connected cell portion), and coated with an organic resin layer (not shown) composed of EVA and ETFE. The gap between adjacent cells was set at 1 mm.

Figure 5C:
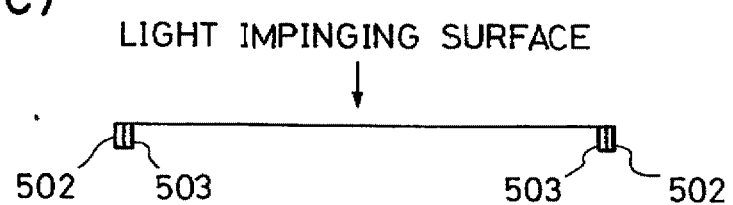

Then, five of the ten modules were each bent at portions having conductive foils 503 by using a bender along the dashed lines in FIGS. 5(a) and 5(b) (the lines being positioned outside etching lines 501 but inside copper foils 502) perpendicularly to the conductive base plate. FIG. 5(c) is a sectional view along line 5C–5C' in FIGS. 5(a) and 5(b) after the bending.

Then, the five modules subjected to the bending and the other five modules not subjected to the bending were arranged side-by-side with no gaps therebetween. As a result of measuring an installation area occupied by each set of five modules, the area of the five modules subjected to the bending was 2.23 m$^2$, whereas the area of the five modules not subjected to the bending was 2.31 m$^3$.

It was thus concluded that the bending step effected in this Example 6 is effective to achieve power generation in a smaller area and the area efficiency per module can be improved.

According to the present invention, as described hereinabove, a photovoltaic device which is adaptable for an enlarged cell area and having a high conversion efficiency can be provided. Further, by utilization of ultrasonic welding, a photovoltaic device which has high reliability and is easily manufactured with low production cost can be provided.

While the present invention has been described with respect to what is presently considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded to the broadest interpretation so as to encompass all such modifications and equivalent structures and functions.

What is claimed is:

1. A photovoltaic device comprising at least a photoactive semiconductor layer formed on one major surface of a conductive base plate, wherein at least one conductive foil having a higher conductivity than said conductive base plate and being in electrical contact with said conductive base plate is formed along at least one side edge of the non-light receiving surface of said conductive base plate and not in contact with said photoactive semiconductor layer.

2. A photovoltaic device according to claim 1, wherein said conductive foil comprises copper as a main ingredient.

3. A photovoltaic device according to claim 1, wherein said conductive foil has a thickness in the range of 70 μm to 150 μm.

4. A photovoltaic device according to claim 1, wherein said conductive base plate is made of stainless steel.

5. A photovoltaic device according to claim 1, wherein said conductive foil and said conductive base plate are welded together by ultrasonic welding.

6. A photovoltaic device according to claim 1, wherein said at least one conductive foil comprises a pair of conductive foils provided along each of two side edges of said conductive base plate facing each other.

7. A photovoltaic device according to claim 1, wherein a portion of said conductive base plate on which said conductive foil is provided is bent perpendicularly to said conductive base plate.

8. A method of manufacturing a photovoltaic device comprising the steps of:

providing a conductive base plate having four side edges;

forming a photoactive semiconductor layer on one major surface of the conductive base plate; and forming at least one conductive foil having a higher conductivity than the conductive base along at least one side edge of the non-light receiving surface of the conductive base plate; said at least one conductive foil being in electrical contact with the conductive base plate and not in contact with said photoactive semiconductor layer.

9. A method of manufacturing a photovoltaic device according to claim 8, including employing copper as a main ingredient in said conductive foil.

10. A method of manufacturing a photovoltaic device according to claim 8, including employing a conductive foil having a thickness in the range of 70 μm to 150 μm.

11. A method of manufacturing a photovoltaic device according to claim 8 including employing a conductive base plate of stainless steel.

12. A method of manufacturing a photovoltaic device according to claim 8, including welding together said conductive foil and said conductive base plate by ultrasonic welding.

13. A method of manufacturing a photovoltaic device according to claim 8, including employing as said at least one conductive foil, a pair of conductive foils provided along each of two side edges of said conductive base plate facing each other.

14. A method of manufacturing a photovoltaic device according to claim 8, including perpendicularly bending a portion of said conductive base plate on which said conductive foil is provided to said conductive base plate.

15. A photovoltaic device comprising at least a photoactive semiconductor layer formed on one major surface of a conductive base plate, wherein at least one conductive foil having a higher conductivity than said conductive base plate and being in electrical contact with said conductive base plate is formed on a major non-light receiving surface of said conductive base plate, not on the side edges and not in contact with said photoactive semiconductor layer.

16. A method of manufacturing a photovoltaic device comprising the steps of:

providing a conductive base plate having four side edges;

forming a photoactive semiconductor layer on one major surface of the conductive base plate; and forming at least one conductive foil having a higher conductivity than the conductive base on a major non-light receiving surface of said conductive base plate, not on the side edges and not in contact with said photoactive semiconductor layer.

17. A solar cell array comprising a plurality of solar cells wherein each solar cell is comprised of:

at least a photoactive semiconductor layer formed on the front surface of a conductive base plate;

at least one back-surface conductive foil having a higher conductivity than said conductive base plate and in electrical contact with the back surface of said conductive base plate;

at least one front-surface conductive foil having a higher conductivity than said conductive base plate and in electrical contact with collecting electrodes formed on the light-receiving surface of said photoactive semiconductor layer;

wherein said back-side conductive foil of one solar cell and said front-surface conductive foil of an adjacent cell are electrically connected.

* * * * *

UNITED STATES PATENT AND TRADEMARK OFFICE
CERTIFICATE OF CORRECTION

PATENT NO. : 5,667,596

DATED : September 16, 1997

INVENTOR(S) : KOJI TSUZUKI ET AL.

It is certified that error appears in the above-identified patent and that said Letters Patent is hereby corrected as shown below:

COLUMN 7

Line 45, "pin-" should read --pn---.

COLUMN 8

Line 59, "ZnO film/250°C" should read --Zno film-- and "P-CVD" should read --P-CVD/250°C--.

COLUMN 10

Line 3, "cell" (first occurrence) should be deleted.

COLUMN 11

Line 66, "shown" should read --shown in--.

UNITED STATES PATENT AND TRADEMARK OFFICE
CERTIFICATE OF CORRECTION

PATENT NO. : 5,667,596

DATED : September 16, 1997

INVENTOR(S) : KOJI TSUZUKI ET AL.

It is certified that error appears in the above-identified patent and that said Letters Patent is hereby corrected as shown below:

<u>COLUMN 18</u>

Line 6, "cell" should read --solar cell--.

Signed and Sealed this

Thirty-first Day of March, 1998

Attest:

BRUCE LEHMAN

Attesting Officer

Commissioner of Patents and Trademarks